United States Patent [19]

Shieh

[11] Patent Number: 6,160,750
[45] Date of Patent: Dec. 12, 2000

[54] NOISE REDUCTION DURING SIMULTANEOUS OPERATION OF A FLASH MEMORY DEVICE

[75] Inventor: Ming-Huei Shieh, Cupertino, Calif.

[73] Assignee: Advanced Micro Devices, Inc., Sunnyvale, Calif.

[21] Appl. No.: 09/498,205

[22] Filed: Feb. 4, 2000

[51] Int. Cl.[7] .................................................. G11C 7/02
[52] U.S. Cl. .................................................. 365/230.03
[58] Field of Search ........................... 365/189.04, 220, 365/194, 230.03

[56] References Cited

U.S. PATENT DOCUMENTS

| | | | |
|---|---|---|---|
| 5,768,205 | 6/1998 | Hashimoto et al. | 365/220 |
| 5,864,505 | 1/1999 | Higuchi | 365/189.04 |
| 5,867,430 | 2/1999 | Chen et al. | 365/189.04 |
| 6,021,077 | 2/2000 | Nakaoka | 365/221 |

*Primary Examiner*—Son T. Dinh
*Attorney, Agent, or Firm*—Brinks Hofer Gilson & Lione

[57] ABSTRACT

A flash memory device (100) includes a first bank (194) and a second bank (196) of memory cells. Address logic (416, 418, 420, 422) is configured to access read data at a first location in the first bank according to first address data. The address logic is configured to substantially simultaneously access for writing a plurality of second locations in the second bank according to second address data. The address logic is configured to access the plurality of second locations by varying only a single bit of the second address data at a time. This reduces the total number of address signals changing during sector erase in the flash memory device, thereby reducing noise which previously impacted the sense margin and access time in the device.

19 Claims, 3 Drawing Sheets

Fig. 1

```
Sector
Address        X/Y Address
---------------------------------------------------
A    A      A  A  A  A  A  A  A  A  A  A  A  A  A  A  ← 204
1    1      1  1  1  1  1  9  8  7  6  5  4  3  2  1
6    5      4  3  2  1  0

1    1      1  1  1  1  1  1  1  1  1  1  1  1  1  1  ← 206
                                  ⋮
                                  ⋮                    ← 208
                                  ⋮
1    1      0  0  0  0  0  0  0  0  0  0  0  0  0  0  ←--
1    0      1  1  1  1  1  1  1  1  1  1  1  1  1  1  ←--- switching across
                                                             sector boundary
                                  ⋮
                                  ⋮
                                  ⋮
1    0      0  0  0  0  0  0  0  0  0  0  0  0  0  0  ←--
0    1      1  1  1  1  1  1  1  1  1  1  1  1  1  1  ←--- switching across
                                                             sector boundary
                                  ⋮
                                  ⋮
                                  ⋮
0    1      0  0  0  0  0  0  0  0  0  0  0  0  0  0  ←--
0    0      1  1  1  1  1  1  1  1  1  1  1  1  1  1  ←--- switching across
                                                             sector boundary
                                  ⋮
                                  ⋮
                                  ⋮
0    0      0  0  0  0  0  0  0  0  0  0  0  0  0  0
```

NOISE REDUCTION DURING SIMULTANEOUS OPERATION OF A FLASH MEMORY DEVICE

BACKGROUND OF THE INVENTION

The present invention relates generally to semiconductor memory devices. More particularly, the present invention relates to noise reduction during simultaneous operation of a flash memory device.

Flash memory devices are known which store data in non-volatile memory cells. The data may be subsequently read from individually addressed storage locations. Memory cells can be programmed by applying suitable programming voltages. Similarly, memory cells can be erased to a pre-programmed state by applying suitable erase voltages.

To enhance user convenience, a new family of flash memory devices has been developed providing simultaneous operation. These devices are separated into two banks of memory cells. Each bank is further divided into a number of sectors of a predetermined size. A write operation may be initiated in one bank while simultaneously reading from the other bank. Writing encompasses the erase and verify procedures and is typically done on a sector-by-sector basis. Because the erase and verify operations are slow relative to read access, and because erasing is typically done on sectors of data, many read operations can occur while a write operation is underway.

It has been observed that a large amount of noise is introduced into the memory device during the erase and verify operations. The noise is particularly severe when crossing sector boundaries, that is, when changing the address from one sector to another. This noise can affect the read operation which is occurring simultaneously. The noise can reduce the sensing margin in the sense amplifiers which detect the states of individually addressed memory cells. This can corrupt the data being sensed or increase the time required for accurate sensing of memory cell data states. Both of these conditions are to be avoided.

In one prior device permitting simultaneous operation, read operations are monitored during a write operation in one bank. If a read signal is detected when the embedded write operation is attempting to change multiple address signals as part of an erase or verify operation, the embedded operation will wait for the read operation to occur. While the idea behind this prior implementation is acceptable, its implementation has not been acceptable in commercial devices.

Accordingly, there is a need for an improved method and apparatus for reducing noise during simultaneous operation of a memory such as a flash memory device.

BRIEF SUMMARY

By way of introduction only, noise within a flash memory device is reduced during simultaneous operation by introducing a new sector addressing pattern. Instead of decrementing sector addresses one by one from the top of the sector address space to the bottom of the sector address space, address changes are controlled so that only a single address is switching at any one time. This reduces transient current and reduces noise being coupled into other parts of the memory device such as the sense amplifiers in the portion of the memory address currently performing a read operation.

The foregoing discussion of the preferred embodiments has been provided only by way of introduction. Nothing in this section should be taken as a limitation of the following claims, which define the scope of the invention.

DETAILED DESCRIPTION OF THE PRESENTLY PREFERRED EMBODIMENTS

Figure 1:
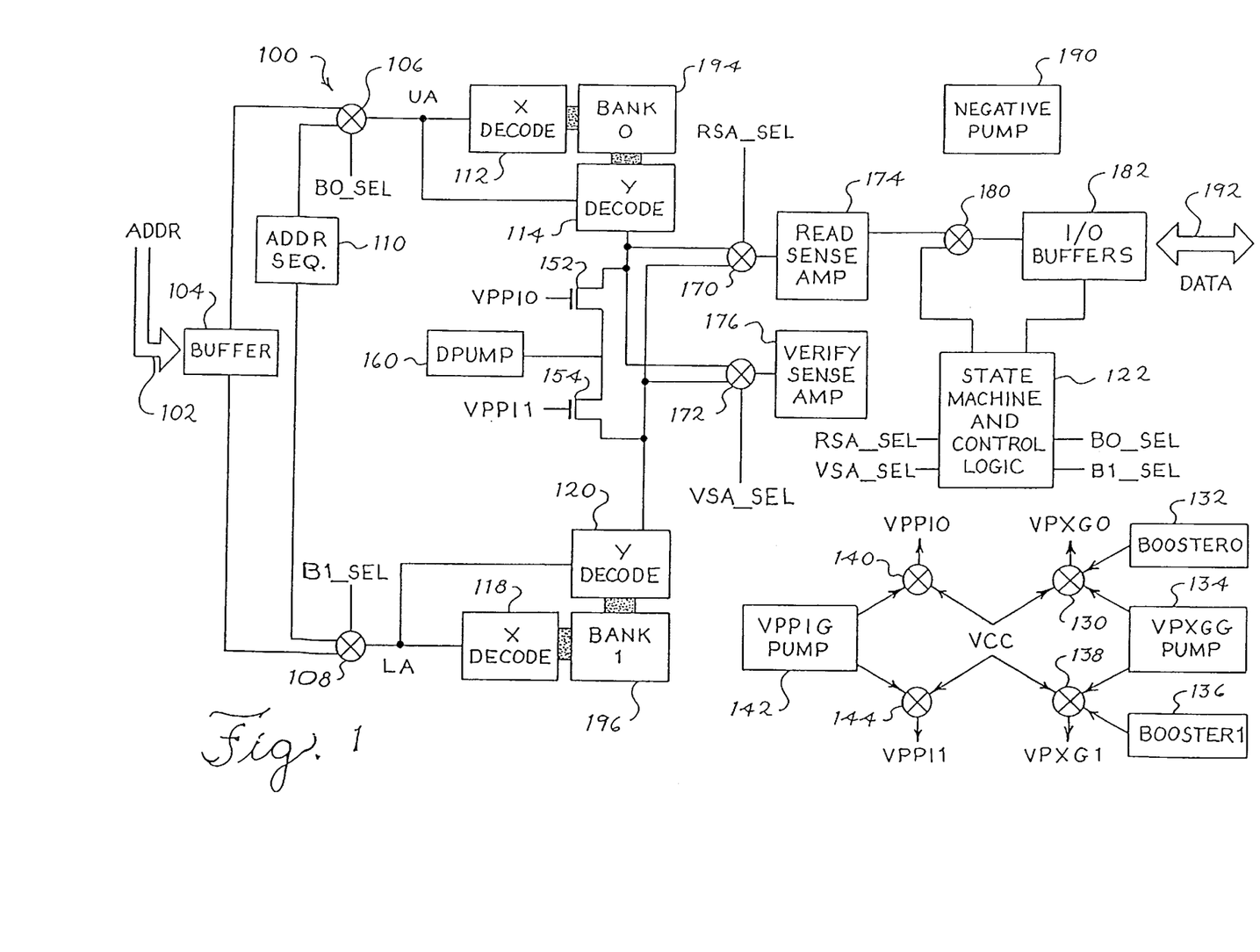
FIG. 1 is a block diagram of a flash memory device.

Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M×16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In the illustrated embodiment, the memory device 100 is a dual-bank memory, including a first bank 196 of memory cells and a second bank 196 of memory cells. In a typical embedded application, of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. Different memory sizes and configurations will require different numbers of address inputs. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffers 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144.

The address input 102 is received by the address buffers 104, which sends the address to the address multiplexer 106 for bank 194 and the address multiplexer 108 for bank 196. The address buffers 104 operate as an address pre-decoder. The X address decoders 112, 118 operate to select one row or word line of bank 0 194 and bank 1 196, respectively. Similarly, the Y decoders 114, 120 operate to select four 16-bit words (in the illustrated embodiment) in bank ) 194 and Bank 1 196, respectively. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence, as will be prescribed in further detail below. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells. Operation of these individual flash memory cells is discussed in more detail below. The banks 194, 196 are organized by words and then by sectors and can either be byte or word addressable. In one particular embodiment, the memory device operates in a page mode in which four 16-bit words are sensed simultaneously and provided one word at a time to the I/O buffers 182. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Vcc is the positive power supply for the memory device 100. Booster one 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 cause multiplexer 106 to select the addresses from the address sequencer 110. The address sequencer 110 is used to cycle through all the addresses in a particular sector to make sure that each address is preprogrammed. The sector is subsequently bulk erased. After erasure, the address sequencer 110 is used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that when a transistor is on, it grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

During a write operation to one of the banks 194, 196 of the memory device 100, an entire sector of the bank is first erased and then the erasure is verified. This is done in an embedded operation under control of the state machine and control logic 122. In particular, the state machine and control logic 122 controls the address sequencer 110 to step sequentially through the addresses of the sector being erased while the appropriate erase voltages are provided to the word line and drain line. Subsequently, the address sequencer 110 steps through the addresses of the sector again sequentially in order to verify that the data in each selected address has been erased.

Figure 2:
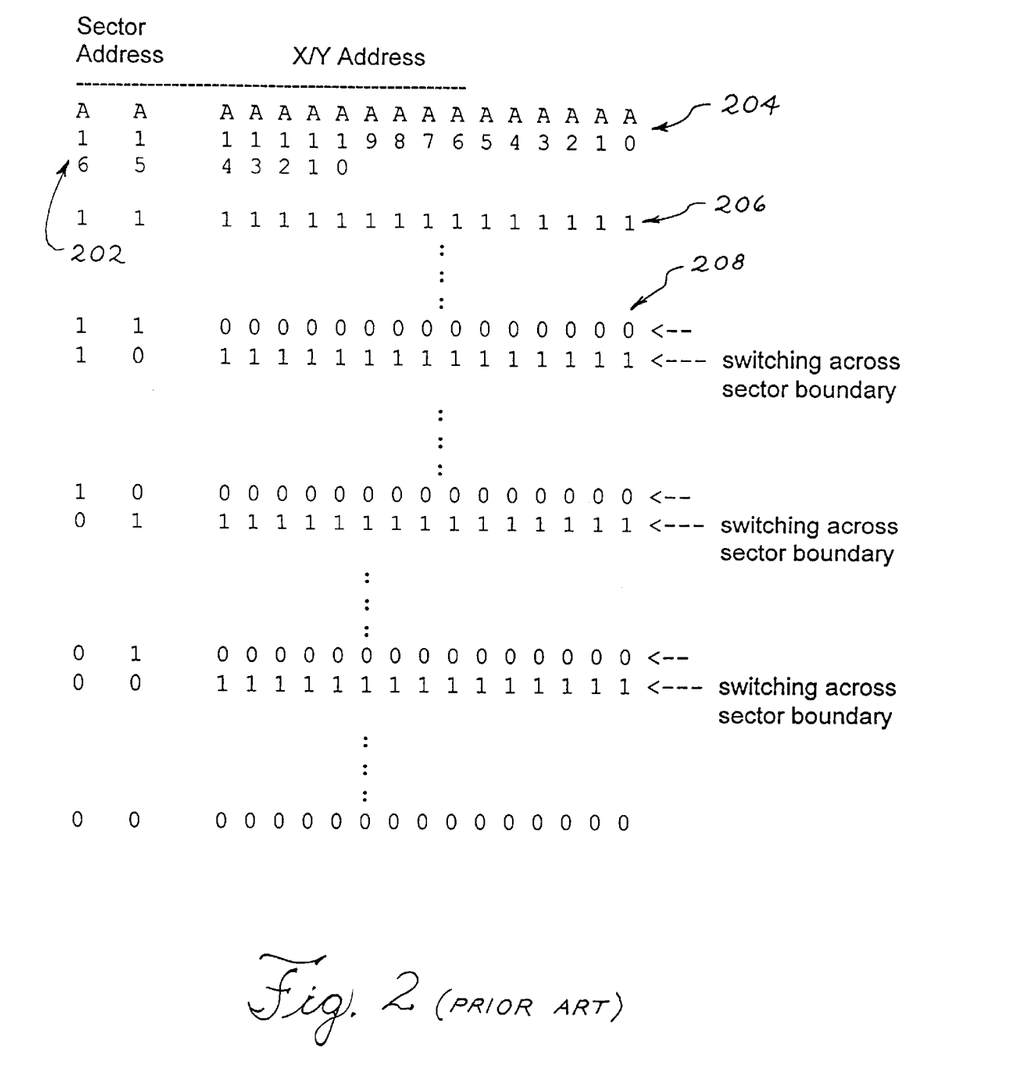
FIG. 2 is a diagram illustrating a prior art sector addressing pattern during an erase operation in the flash memory device of FIG. 1.

FIG. 2 is a diagram illustrating a prior art sector addressing pattern during write and verify operations in the flash memory device of FIG. 1. The illustrated embodiment shows addressing for a memory device having four sectors of 64 Kbytes each. Thus, the address for each storage location in the memory device includes a four bit sector address 202 (corresponding to address bits A16 and A15) and a fifteen bit X/Y address 204 (corresponding to address bits A14–A0). The embodiment of FIG. 2 is for illustrative purposes only. In other embodiments, addressing will be configured differently. For example, in one embodiment, a dual bank flash memory device has a total of 32 sectors requiring a 5 bit sector address.

FIG.2 illustrates the addressing pattern produced by the address sequencer during an erase operation. This is an embedded operation under control of the state machine and control logic 122 (FIG. 1). The pattern followed is that of decrementing the address within a first sector by a single binary value. The sector address 202 is set to an initial sector address value, address 11 in FIG. 2. The address sequencer 110 (FIG. 1) is loaded with an initial value 206 for the X/Y address 204. The initial value is all binary ones. The address sequencer 110 counts down to a final value 208, which is all zeros. Thus, the address value starts out at 111 . . . 111, then is decremented to 111 . . . 110, then decremented to 111 . . . 101, then decremented to 111 . . . 100. Finally, the final all zero value 208 is reached. At that time, the sector address 202 is decremented from 11 to 10. The X/Y address 204 then returns to the initial value 111 . . . 111 and the decrementing process continues for all addresses in sector addressed at sector address 10. After all addresses have been accessed in the sector at sector address 10, the sector address 202 is decremented to sector address 01 and the X/Y address 204 is reset from 000 . . . 000 to 111 . . . 111. Decrementing of the X/Y address 204 continues until an X/Y address of 000 . . . 000 is reached. The sector address 202 is then decremented from 01 to 00 and the X/Y address 204 is reset to 111 . . . 111. Decrementing of the X/Y address 204 proceeds until the X/Y address 000 . . . 000 is reached. In other embodiments, the address sequencer may increment either the sector address 202 or the X/Y address 204 or both, rather than decrementing the addresses.

The address sequencer 110 steps through the addresses, either incrementing or decrementing the addresses from an initial value until a final value is reached, according to the pattern of FIG. 2. In one embodiment, the address sequencer scans from the top edge of the address space (hexadecimal address 1FF) to the bottom edge of the address space (hexadecimal address 000) of the 512 column sector. This is done first during the erase operation for a sector. The address value is decremented, the data at that location are erased, and the address value is decremented again by changing the X/Y address 204. This process is then repeated during the verify operation for the sector. After erasing and then verifying each location in the sector, the address sequencer switches to the next sector by changing the sector address 202.

Employing the prior art address sequencing technique illustrated in FIG. 2 produces substantial noise spikes within the flash memory device 100. Each time the address changes from 000 . . . 000 to 111 . . . 111, all of the bits of the X/Y address 204 are changing value. This is illustrated in FIG. 2 with a fourteen bit X/Y address 204. Such a prior art design is optimized for simplicity, in that a counter circuit associated with the address sequencer may be used to either increment or decrement the specified address value. When the counter circuit reaches a terminal value, corresponding to the edge of the address space, the counter circuit is set or reset. At this point, all of the address bits change. Further, at other times during the advance through the address space, it frequently occurs that many address signals, such as six, seven, or eight address signals, change at the same time. Again, during these periods, substantial noise spikes are created in the flash memory device. The noise spikes are due to transient current as the address decoding circuitry changes states to select a new column (Y decoder) and a new row (X decoder).

In the simultaneous operation device of FIG. 1, the noise spikes described above in connection with the erase and verify embedded processes occur in one bank of the flash memory device while a read operation is occurring in the other bank of the flash memory device. The noise spikes are transferred from the bank which is being written to the bank which is being read over the power (Vcc) and ground (Vss) buses of the flash memory device, as well as signal lines of the flash memory device.

In accordance with the present invention, unlike the addressing pattern of FIG. 2, address bits generated by the address sequencer 110 are constrained to change only one bit at a time. Thus, the address pattern for two bits is as follows, 00; 01; 11; 10; then repeating to 00. This can be readily extended to any number of address bits. In general, on each address change during a sequential write or erase operation, address changes are limited to a predetermined number of changing bits. Preferably, only a single bit of the address changes. This technique is similar to a gray code for data transmission and encoding.

This technique can be extended from the two-bit addressing scheme illustrated above to an addressing scheme of any number of bits. In a memory, the technique includes accessing a first location of the memory. The first location is defined by first address data. Substantially simultaneously, the technique further includes accessing a second location of the memory. The second location is defined by second address data. The second location may be in another bank, as shown in FIG. 1, or may simply be a different location of a memory device. According to the technique, noise in sensing the second location is reduced by limiting the changes in the first address data during the access of the second data. The addressing scheme in accordance with the present invention limits changes in the address data used to address the selected location. Preferably, as illustrated in above, only a single bit of the address data is changed each time. By changing only a single bit, the current spikes introduced by the switching address decoder and other circuits are minimized. This, in turn, reduces the noise introduced to the power and ground and signal buses. Overall noise in the chip is reduced and the effects on the sensing margin and sensing time in the read circuitry of the other bank are minimized.

Figure 3:
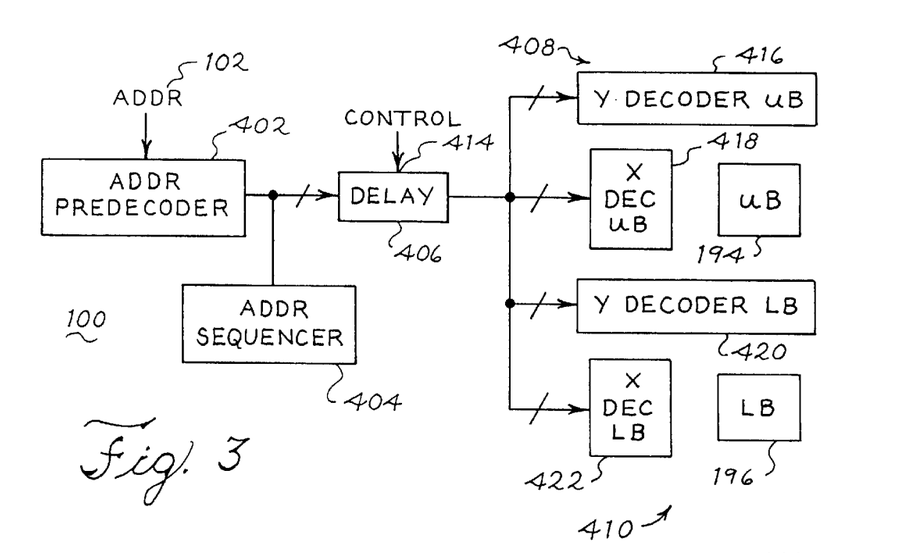
FIG. 3 is a block diagram of a portion of the flash memory of FIG. 1.

FIG. 3 illustrates a block diagram of a portion of the flash memory device 100 of FIG. 1. In FIG. 3 the flash memory device 100 includes an address pre-decoder 402, an address sequencer 404, a delay circuit 406, addressing circuitry 408 for the first or upper bank 194 and addressing circuitry 410 for the second or lower bank 196. The address pre-decoder 402 includes circuits such as the address buffers 104 and may further include an initial stage of address decoding and combinatorial logic for selecting appropriate addresses of the upper bank 194 and lower bank 196. The address pre-decoder 402 receives a multiple bit address 102 and produces true and complement values for each input address bit. These true and complement values may be combined in a first stage of address decoding in the address pre-decoder 402.

The address sequencer 404 operates during an embedded operation mode of the flash memory device 100. The address sequencer 404 controls the address to which address signals are provided and the address to which verify signals are received during a write operation. The address sequencer operates on a sector-by-sector basis, decoding a sector of the selected upper bank 194 or lower bank 196 and sequentially stepping through the addresses within the decoded sector. After each storage location addressable within the selected sector has been erased and then verified, the address sequencer then selects another sector of the bank to be written or erased.

During simultaneous operation of a dual bank memory, then, the first bank forms a first storage means for storing read data when that bank is accessed during a read operation. The second bank forms a second storage means for storing data. The address circuits including the address predecoder and X decoder and Y decoder associated with the first bank form a first addressing means for providing a read address to the first storage means. The address sequencer forms a second addressing means for providing a plurality of sequential write addresses to the second storage means. In accordance with the present embodiment, the address sequencer varies only a predetermined number of bits of each sequential write address to reduce switching in the memory.

The delay circuit 406 operates in response to a control signal received at a control input 414 to delay selected address signals of the address provided to the addressing circuitry 408, 410 to reduce the number of bits changing at one time of the address data. Any number of bits may be delayed by any suitable delay time to control the simultaneous switching of the write address provided by the delay circuit 406. Any suitable delay circuitry may be provided to perform the function of the delay circuit 406. The delay circuitry may be implemented using passive components such as resistors and capacitors to introduce the necessary delay. Alternatively, the delay circuitry 406 may be implemented using digital components such as counters, etc. to control the delay applied to appropriate address signals. In this embodiment incorporating the delay circuit 406, the delay circuit 406 forms a second addressing means for providing a plurality of sequential write addresses to the bank to be written.

As illustrated in the addressing pattern of described, the delay circuit 406 preferably operates to change only one bit at a time of the address data provided to the addressing circuitry 408, 410 which is active to decode addresses to be written in the upper bank 194 and lower bank 196. Other address signals are not delayed. For example, in the bank to be read, the address signals are not delayed but are provided without delay to the addressing circuitry 408, 410. This minimizes the effect on the operation of the flash memory device, including the read access time for the flash memory device 100, which is to be minimized. Only the addressing signals from the address sequencer 404 are affected by the delay circuit 406.

The addressing circuitry 408 includes a Y decoder 416 and an X decoder 418. Similarly, the addressing circuitry 410 includes a Y decoder 420 and an X decoder 422. These decoding circuits 408, 410 generally operate in the same manner as described above in connection with FIG. 1. During simultaneous operation of the flash memory device 100, the decoding circuits 408, 410 operate to select a unique address in one of the upper bank 194 and lower bank 196 for a read operation and another address in the other bank for a write operation. Other circuitry not shown in FIG. 3 provides the necessary signals to control the erase-and-verify operations of the write operation. Similarly, other circuitry not shown in FIG. 3 includes sense amplifiers and other sensing circuitry necessary to complete the read operation.

Figure 4:
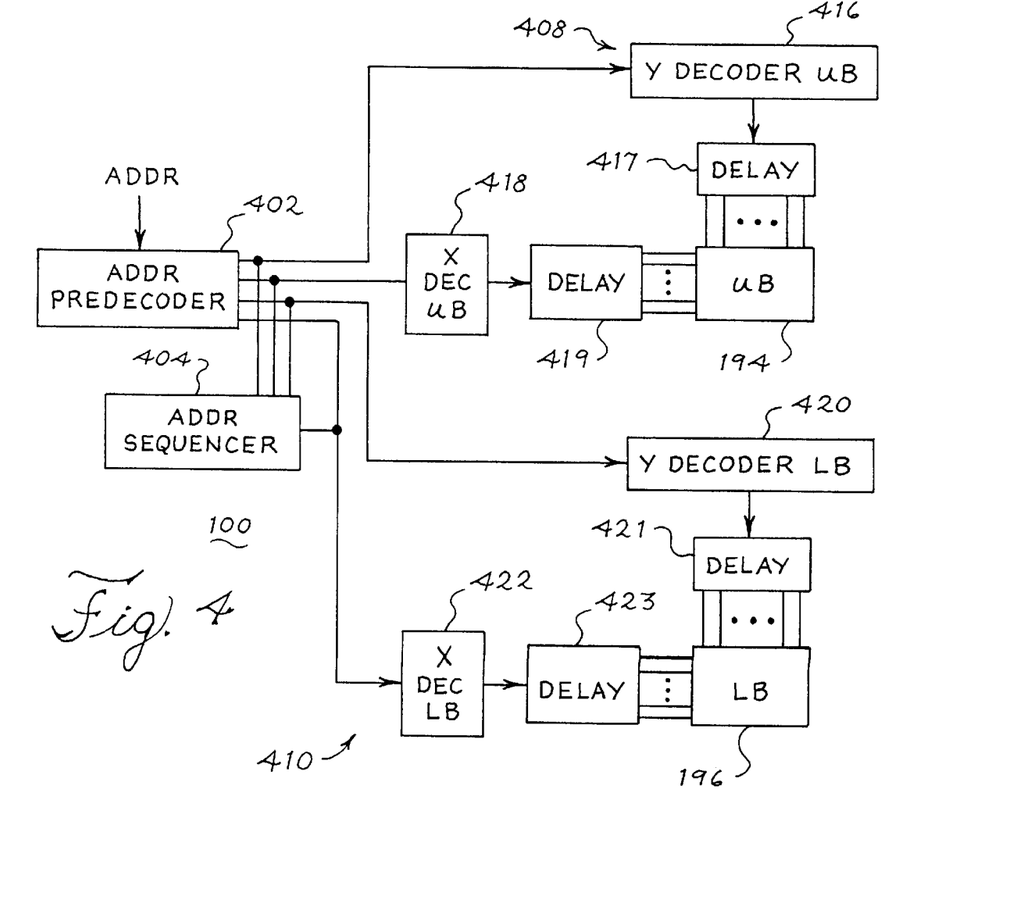
FIG. 4 is a block diagram of a portion of the flash memory device of FIG. 1.

FIG. 4 illustrates a portion of the flash memory device 100 of FIG. 1. FIG. 4 illustrates an alternative embodiment of the flash memory device configured for limiting changes in write address data during a read access of another location in the flash memory device. In FIG. 4, the flash memory device 100 includes an address pre-decoder 402 and address sequencer 404, addressing circuitry 408 associated with the upper bank 194 and addressing circuitry 410 associated with the lower bank 196. The addressing circuitry 408 associated with the upper bank 194 includes a Y decoder 116 and associated delay circuit 417, and an X decoder circuit 418 and associated delay circuit 419. Similarly, the addressing circuitry 410 associated with lower bank 196 includes a Y decoder circuit 420 and associated delay circuit 421, along with an X decoder 422 and associated delay circuit 423.

The address pre-decoder 402 receives an address signal from external to the flash memory device 100. The address pre-decoder 402 operates to generate true and complement values of the individual bits of the address signal and may further operate to combine in a first decoding stage some of the true and complement bits. The pre-decoded address information is provided to the decoding circuitry 408, 410 for final decoding. The address sequencer 404 operates in an embedded operation mode to control the address signals provided to the address decoding circuitry 408, 410 during a write operation, including erase operations and verify operations. During one of these operations, the address sequencer 404 steps through the addresses within a sector of the upper bank 194 or lower bank 196. The individual addresses are all erased and then verified. Other circuitry, not shown in FIG. 4, provides the signals necessary to erase the individual storage locations and to verify that the erase has been completed.

The addressing circuitry 408, 410 operates in the manner described above to select an address in the upper bank 194 and in lower bank 196 for simultaneous read and write operations. In addition, however, each decoding block 416, 418, 420, 422 includes an associated delay circuit which selectively delays some of the address signals provided to the respective bank of the flash memory device. The delay circuits 417, 419, 421, 423 receive separate control signals (not shown) to select which delay circuits are operational to delay selected address signals. The control circuits may be generated by the state machine of the memory device 100 or by any suitable circuit. In the preferred embodiment, only address signals generated in response to the address sequencer 404 will be delayed. Address signals generated in response to an address input received from off-chip by the address pre-decoder 402 will not be delayed so as to have no effect on the address access time of the memory device 100. The delay circuits 417, 419, 421, 423 operate to change only a predetermined number of bits at a time of the address data generated by the address sequencer during an embedded write operation. Preferably, only a single bit at a time of the address data is changed. However other numbers of bits such as two or three bits may be changed at a time while still minimizing simultaneous switching which creates current spikes and noise to affect the read operation in the other bank. In this embodiment incorporating the delay circuits 417, 419, 421, 423, the delay circuits 417, 419, 421, 423 form a second addressing means for providing a plurality of sequential write addresses to the bank to be written From the foregoing, it can be seen that the present invention provides an improved method and apparatus for reducing noise during simultaneous operation of a flash memory device. The number of changing address lines in the bank of the memory device being written is controlled to limit the switching noise introduced into the sensing circuits associated with the bank of the memory device being read. Preferably, only a single write address bit is changed by the address sequencer at a time, for example using a decoding a scheme similar to a gray code. Alternatively, some address bits may be selectively delayed to change the timing of these bits so that the changes in address data are limited to only a predetermined number of changing bits at any given time. This reduces noise in the memory device, improves the sense margin in the read circuits of the memory device, and reduces access time for the memory device.

While one embodiment of the invention has been shown and described, variations are possible. For example, while the invention has been described in relation to a dual bank, page mode memory integrated circuit, the inventive concepts and details may be applied to other types of integrated circuits as well. It is therefore intended in the appended claims to cover all such modifications falling within the true spirit and scope of the claims.

What is claimed is:

1. A method for operating a memory devise, the method comprising steps of:
   accessing a first location of the memory devise defined by first address data;
   substantially simultaneously, accessing a second location of the memory device defined by second address data;
   limiting changes in the first address data during the access of the second location.

2. The method of claim 1 wherein the method further comprises accessing a plurality of first locations by varying the first address data substantially simultaneously with accessing the second location.

3. The method of claim 2 wherein limiting changes in the first address comprises:
   changing only one bit at a time of the first address data.

4. A method for operating a memory device, the method comprising:
   accessing a first location of the memory device defined by first address data;
   accessing a plurality of first locations by varying the first address data substantially simultaneously with accessing the second location;
   substantially simultaneously, accessing a second location of the memory device defined by second address data; and
   limiting changes in the first address data during the access of the second location; and
   delaying selected address signals of the address to reducing the number of bits changing at one time of the first address data.

5. The method of claim 1 further comprising:
   accessing a plurality of first bank locations defined by the first address data in a first bank of the memory device;
   substantially simultaneously, accessing a second bank location defined by the second address data of a second bank of the memory device;
   changing only a predetermined number of bits at a time of the first address data.

6. A method for operating a memory device, the method comprising:
   accessing a first location of the memory device defined by first address data;
   substantially simultaneously, accessing a second location of the memory device defined by second address data;
   reading data from the second location; and
   limiting changes in the first address data during the access of the second location sequentially writing data in a plurality of first locations defined by the first address data.

7. The method of claim 6 wherein limiting changes in the first address data comprises:
   changing only a predetermined number of bits of the first address data during a predetermined time period.

8. The method of claim 6 wherein limiting changes in the first address data comprises:
   changing only a single bit at a time of the first address data.

9. The method of claim 8 wherein the method further comprises:
   reading data from one or more read locations in one bank of the memory device; and
   while reading the data, erasing data in a sector of another bank of the memory device.

10. A memory device comprising:
    a first bank of memory cells;
    a second bank of memory cells;
    address logic configured to access read data at a first location if the first bank according to first address data and substantially simultaneously access for writing a plurality of second location in the second bank according to second address data, the address logic configured to access the plurality of second locations by varying only a single bit of the second address data at a time.

11. A memory device comprising:
    a first bank of memory cells;
    a second bank of memory cells;
    address logic configured to access read data at a first location in the first bank according to first address data and substantially simultaneously access for writing a plurality of second locations in the second bank according to second address data, the address logic including a delay circuit which delays switching of some bits of the second address data.

12. The memory device of claim 11 wherein the address logic further comprises:
    address input buffers positioned to provide input address signals to the delay circuit.

13. The memory device of claim 11 wherein the address logic further comprises:
    address decoders coupled to the delay circuit and responsive to delayed bits and un-delayed bits of the second address data to access the plurality of second locations.

14. The memory device of claim 10 wherein the second bank comprises a plurality of sectors, each sector including sector storage locations defined by the second address data.

15. The memory device of claim 14 further comprising
    a sector erase circuit configured to provide erase signals to the sector storage locations defined by the second address data.

16. The memory device of claim 15 wherein the address logic comprises:
    an address sequencer configured to generate the second address data.

17. A memory device comprising:
    first storage means for storing read data;
    second storage means for storing data; and
    addressing means including
       first addressing means for providing a read address to the first storage means;
       second addressing means for providing a plurality of sequential write addresses to the second storage means, the second addressing means varying only a predetermined number of bits of each sequential write address to reduce switching noise in the memory device.

18. The memory device of claim 17 wherein the second addressing means comprises an address sequencer.

19. The memory device of claim 17 further comprising:
    sensing means for detecting the read data accessed by the read address; and
    programming means for providing programming voltage to storage locations associated with each sequential write address substantially simultaneously with the sensing means detecting the read data.

* * * * *